(12) United States Patent
Ookura et al.

(10) Patent No.: US 12,396,146 B2
(45) Date of Patent: Aug. 19, 2025

(54) ELECTROMAGNETIC WAVE SHIELD FILM

(71) Applicant: Tatsuta Electric Wire & Cable Co., Ltd., Higashiosaka (JP)

(72) Inventors: Katsuma Ookura, Kyoto (JP); Yoshiharu Yanagi, Kyoto (JP); Hiroshi Tajima, Kizugawa (JP)

(73) Assignee: TATSUTA ELECTRIC WIRE & CABLE CO., LTD., Osaka (JP)

( * ) Notice: Subject to any disclaimer, the term of this patent is extended or adjusted under 35 U.S.C. 154(b) by 18 days.

(21) Appl. No.: 18/694,551

(22) PCT Filed: Sep. 29, 2022

(86) PCT No.: PCT/JP2022/036329
§ 371 (c)(1),
(2) Date: Mar. 22, 2024

(87) PCT Pub. No.: WO2023/054543
PCT Pub. Date: Apr. 6, 2023

(65) Prior Publication Data
US 2024/0389290 A1 Nov. 21, 2024

(30) Foreign Application Priority Data

Sep. 29, 2021 (JP) .................. 2021-159465

(51) Int. Cl.
H05K 9/00 (2006.01)
(52) U.S. Cl.
CPC .................. *H05K 9/0084* (2013.01)
(58) Field of Classification Search
CPC .................................... H05K 9/0084
See application file for complete search history.

(56) References Cited

U.S. PATENT DOCUMENTS

| 10,820,457 | B1 * | 10/2020 | Kishi | B32B 15/09 |
| 2014/0326484 | A1 * | 11/2014 | Tajima | H05K 9/00 174/250 |
| 2021/0059042 | A1 * | 2/2021 | Yamauchi | H05K 9/0088 |

FOREIGN PATENT DOCUMENTS

| JP | 2013004854 A | 1/2013 |
| JP | 6003014 B | 10/2016 |
| JP | 2017079218 A | 4/2017 |
| JP | 2021027101 A | 2/2021 |

OTHER PUBLICATIONS

International Search Report issued in connection with underlying international application PCT/JP2022/036329.
Written Opinion issued in connection with underlying international application PCT/JP2022/036329.

* cited by examiner

*Primary Examiner* — Hung V Ngo
(74) *Attorney, Agent, or Firm* — RANKIN, HILL & CLARK LLP

(57) ABSTRACT

An electromagnetic wave shielding film with high bending resistance includes a protecting layer, a metal layer, and an adhesive layer stacked in this order. A ratio of Repulsion Y to Repulsion X ([Repulsion Y]/[Repulsion X]) is 0.77 or higher, where Repulsion X denotes a repulsion of a stack including the protecting layer and the metal layer measured in a defined test for measuring repulsion of stacks, and Repulsion Y denotes a repulsion of the adhesive layer measured in a defined test for measuring repulsion of adhesive layers.

6 Claims, 2 Drawing Sheets

ELECTROMAGNETIC WAVE SHIELD FILM

TECHNICAL FIELD

The present invention relates to an electromagnetic wave shielding film.

BACKGROUND ART

An electromagnetic wave shielding film is conventionally attached to a printed wiring board, e.g., a flexible printed wiring board (FPC), to shield it from electromagnetic waves from outside.

In electronic devices developed in recent years such as foldable smartphones, printed wiring boards may be folded.

When a printed wiring board is folded in use, an electromagnetic wave shielding film is also folded with the printed wiring board.

Therefore, electromagnetic wave shielding films are desired to have a higher bending resistance.

Patent Literature 1 discloses an electromagnetic wave shielding adhesive sheet (electromagnetic wave shielding film) with improved bending resistance.

Specifically, Patent Literature 1 discloses an electromagnetic wave shielding adhesive sheet including a conductive layer and an insulating layer, wherein the conductive layer contains 3 to 200 parts by weight of a curing agent (B) per 100 parts by weight of a resin (A); the insulating layer contains 3 to 200 parts by weight of a curing agent (D) per 100 parts by weight of a resin (C); the resin (A) is any resin selected from the group consisting of a phenol resin, a silicone resin, a urea resin, an acrylic resin, a polyester resin, a polyamide resin, and a polyimide resin; and the electromagnetic wave shielding adhesive sheet satisfies the following (i) and (ii):

(i) When the electromagnetic wave shielding adhesive sheet is pressure-bonded with a 25 μm-thick polyimide film, which is assumed to have a repulsion of 100, at a temperature of 150° C. and a pressure of 2 MPa for 30 minutes to obtain a sheet (X), the repulsion of the sheet (X) is more than 130 and 400 or less, (ii) After the electromagnetic wave shielding adhesive sheet is heated at 150° C. for 10 minutes, the conductive layer and the insulating layer each have a gel fraction of 40 to 97%.

CITATION LIST

Patent Literature

Patent Literature 1: JP 6003014 B

SUMMARY OF INVENTION

Technical Problem

The bending resistance of the electromagnetic wave shielding adhesive sheet (electromagnetic wave shielding film) according to Patent Literature 1 is improved due to the predetermined repulsion and the predetermined parameters of the gel fractions of the conductive layer and the insulating layer.

However, such an electromagnetic wave shielding adhesive sheet (electromagnetic wave shielding film) does not have sufficient bending resistance.

The present invention has been made in consideration of the problem described above and an object thereof is to provide an electromagnetic wave shielding film with sufficiently high bending resistance.

Solution to Problem

The present inventors found that the bending resistance of an entire electromagnetic wave shielding film including a protecting layer, a metal layer, and an adhesive layer stacked in this order can be improved by controlling the repulsion of a stack including the protecting layer and the metal layer and the repulsion of the adhesive layer. Based on the finding, the inventors completed the present invention.

Specifically, the electromagnetic wave shielding film according to the present invention includes a protecting layer, a metal layer, and an adhesive layer stacked in this order, wherein a ratio of Repulsion Y to Repulsion X ([Repulsion Y]/[Repulsion X]) is 0.77 or higher, where Repulsion X denotes a repulsion of a stack including the protecting layer and the metal layer measured in a test for measuring repulsion of stacks described below, and Repulsion Y denotes a repulsion of the adhesive layer measured in a test for measuring repulsion of adhesive layers described below.

The ratio of the Repulsion Y to the Repulsion X ([Repulsion Y]/[Repulsion X]) is preferably 0.82 or higher.

Test for Measuring Repulsion of Stacks:

Two pieces of a stack including a protecting layer and a metal layer are produced.

Next, a polyimide film with a thickness of 50 μm is prepared. One piece and the other piece of the stack are stacked on one face and the other face of the polyimide film, respectively, such that the pieces overlap with each other, while the metal layer is placed on the polyimide film via an epoxy resin-based adhesive with a thickness of 1 μm.

Subsequently, the resulting stack is heated and pressurized at 3 MPa and 170° C. for three minutes, further heated at atmospheric pressure at 150° C. for one hour, and then cut to have a 60-mm long side and a 10-mm short side to produce a sample of the stack.

One main face and the other main face of the obtained sample of the stack are defined as a first main face and a second main face, respectively.

Next, the sample of the stack is bent into a U shape centered on a longitudinal center of the sample of the stack such that the long side of the sample of the stack is bent and the first main face of the sample of the stack is on the inner side. Thereafter, the bent sample of the stack is placed on a pressure meter equipped with a lower jig and a pressing jig, and the distance between the lower jig and the pressing jig is adjusted to 0.5 mm.

After maintaining this state for three seconds, a repulsion of the sample of the stack is measured and defined as Repulsion X of the stack.

Test for Measuring Repulsion of Adhesive Layers:

Two pieces of an adhesive layer are produced.

Next, a polyimide film with a thickness of 50 μm is prepared. One piece and the other piece of the adhesive layer are stacked on one face and the other face of the polyimide film, respectively, such that the pieces overlap with each other.

Subsequently, the resulting stack is heated and pressurized at 3 MPa and 170° C. for three minutes, further heated at atmospheric pressure at 150° C. for one hour, and then cut to have a 60-mm long side and a 10-mm short side to produce a sample of the adhesive layer.

One mainface and the other main face of the obtained sample of the adhesive layer are defined as a third main face and a fourth main face, respectively.

Next, the sample of the adhesive layer is bent into a U shape centered on a longitudinal center of the sample of the adhesive layer such that the long side of the sample of the adhesive layer is bent and the third main face of the sample of the adhesive layer is on the inner side. Thereafter, the bent sample of the adhesive layer is placed on a pressure meter equipped with a lower jig and a pressing jig, and the distance between the lower jig and the pressing jig is adjusted to 0.5 mm.

After maintaining this state for three seconds, a repulsion of the sample of the adhesive layer is measured and defined as Repulsion Y of the adhesive layer.

A ratio of Repulsion Y to Repulsion X ([Repulsion Y]/[Repulsion X]) of 0.77 or higher means that the adhesive layer has a higher repulsion than conventional electromagnetic wave shielding films.

At a ratio of Repulsion Y to Repulsion X ([Repulsion Y]/[Repulsion X]) of 0.77 or higher, when a bending stress is applied to the electromagnetic wave shielding film, the adhesive layer functions as a support, so that the bending stress applied to the protecting layer and the metal layer is distributed and is less likely to focus on one point. Consequently, the protecting layer is less likely to be broken by bending, whereby the bending resistance of the electromagnetic wave shielding film is improved.

The electromagnetic wave shielding film according to the present invention preferably includes conductive particles. The adhesive layer including conductive particles functions as a conductive adhesive layer.

Here, the electromagnetic wave shielding film according to the present invention is to be mounted on a printed wiring board. Generally, a printed wiring board includes a base film provided with a printed circuit including a ground circuit and a coverlay that is on the base film and covers the printed circuit.

Upon mounting the electromagnetic wave shielding film according to the present invention on a printed wiring board, an opening to expose the ground circuit is formed in the coverlay so that the ground circuit comes into contact with the adhesive layer of the electromagnetic wave shielding film. Thus, the ground circuit of the printed wiring board is electrically connected to the metal layer of the electromagnetic wave shielding film.

In other words, when the adhesive layer includes conductive particles, the metal layer of the electromagnetic wave shielding film functions as a shielding layer. Then, the electrical connection of the metal layer to the ground circuit of the printed wiring board improves the electromagnetic wave shielding characteristics.

In the electromagnetic wave shielding film according to the present invention, the adhesive layer preferably includes the conductive particles in a weight ratio of 30 wt % or higher.

When the weight ratio of the conductive particles is 30 wt % or higher, the Repulsion Y of the adhesive layer is improved, thereby increasing the ratio of the Repulsion Y to the Repulsion X. Thus, the bending resistance of the electromagnetic wave shielding film is improved.

In the electromagnetic wave shielding film according to the present invention, the Repulsion X is preferably 1 to 10 N/cm.

In the electromagnetic wave shielding film according to the present invention, the Repulsion Y is preferably 0.77 to 15 N/cm.

When the Repulsion X and the Repulsion Y are each within the above range, the bending resistance of the electromagnetic wave shielding film is further improved.

Advantageous Effects of Invention

The present invention can provide an electromagnetic wave shielding film with sufficiently high bending resistance.

DESCRIPTION OF EMBODIMENTS

Hereinafter, the electromagnetic wave shielding film according to the present invention is described in specific terms. However, it should be noted that the present invention is not limited to the embodiments described below and that the present invention can be appropriately modified and applied without deviating from the gist of the invention.

Figure 1:
FIG. 1 is a cross-sectional view schematically showing one example of an electromagnetic wave shielding film according to the present invention.

FIG. 1 is a cross-sectional view schematically showing one example of an electromagnetic wave shielding film according to the present invention.

As shown in FIG. 1A, an electromagnetic wave shielding film 10 is an electromagnetic wave shielding film including a protecting layer 20, a metal layer 30, and an adhesive layer 40 stacked in this order.

In the electromagnetic wave shielding film 10, a ratio of Repulsion Y to Repulsion X ([Repulsion Y]/[Repulsion X]) is 0.77 or higher, where Repulsion X denotes a repulsion of a stack including the protecting layer 20 and the metal layer 30 measured in a test for measuring repulsion of stacks, and Repulsion Y denotes a repulsion of the adhesive layer 40 measured in a test for measuring repulsion of adhesive layers.

Here, the test for measuring repulsion of stacks is described using the figures.

Figure 2A:
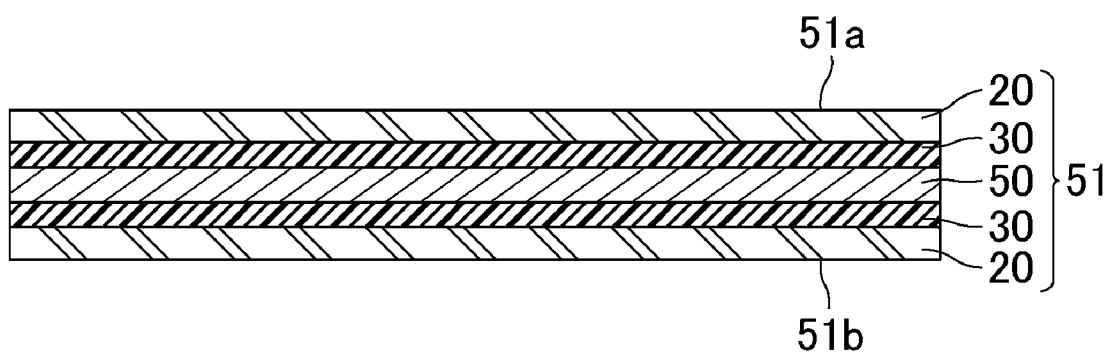
FIG. 2A is a cross-sectional view schematically showing one example of a sample of a stack produced in a test for measuring repulsion of stacks.

FIG. 2A is a cross-sectional view schematically showing one example of a sample of a stack produced in a test for measuring repulsion of stacks.

Figure 2B:
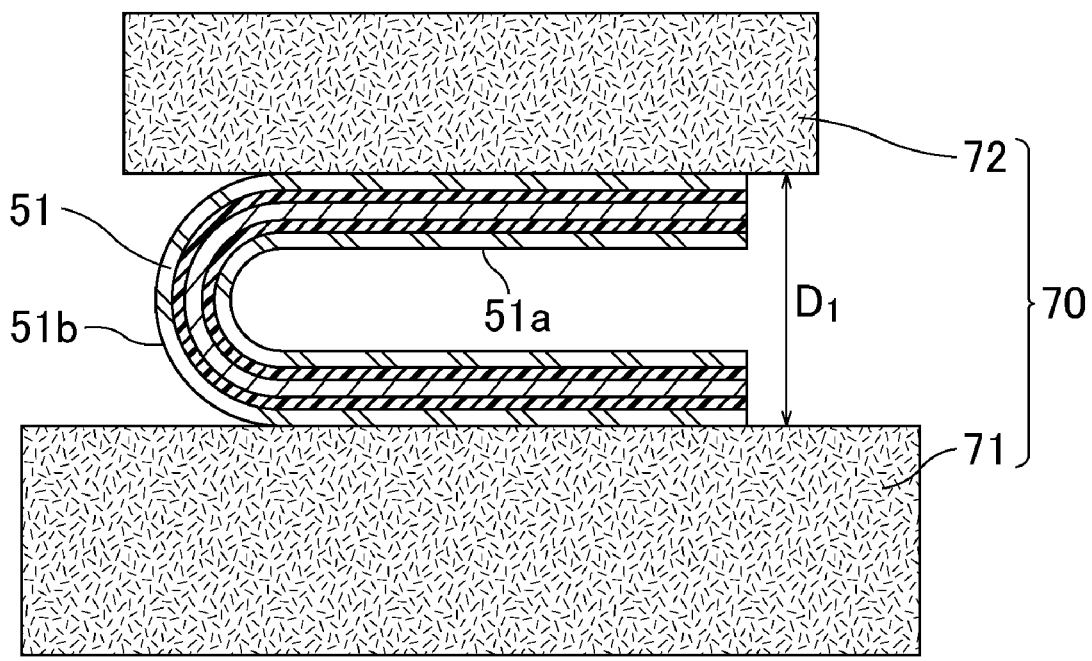
FIG. 2B is a diagram schematically showing how the repulsion of the stack is measured in the test for measuring repulsion of stacks.

FIG. 2B is a diagram schematically showing how the repulsion of the stack is measured in the test for measuring repulsion of stacks.

In order to perform the test for measuring repulsion of the stack, first, two pieces of a stack including the protecting layer 20 and the metal layer 30 are produced.

Next, a polyimide film 50 with a thickness of 50 μm is prepared.

Then, one piece and the other piece of the stack are stacked on one face and the other face of the polyimide film 50, respectively, such that the pieces overlap with each other, while the metal layer 30 is placed on the polyimide film 50 via an epoxy resin-based adhesive with a thickness of 1 μm, to produce a sample 51 of the stack.

Subsequently, the resulting stack is heated and pressurized at 3 MPa and 170° C. for three minutes, further heated at atmospheric pressure at 150° C. for one hour, and then cut to have a 60-mm long side and a 10-mm short side to produce the sample 51 of the stack shown in FIG. 2A.

One main face and the other main face of the obtained sample 51 of the stack are defined as a first main face 51a and a second main face 51b, respectively.

Next, as shown in FIG. 2B, the sample 51 of the stack is bent into a U shape centered on a longitudinal center of the sample 51 of the stack such that the long side of the sample 51 of the stack is bent and the first main face 51a of the sample 51 of the stack is on the inner side. Thereafter, the bent sample 51 of the stack is placed on a pressure meter 70 equipped with a lower jig 71 and a pressing jig 72, and the distance (distance indicated by Symbol Di in FIG. 2B) between the lower jig 71 and the pressing jig 72 is adjusted to 0.5 mm.

After maintaining this state for three seconds, a repulsion of the sample 51 of the stack is measured and defined as Repulsion X of the stack.

Next, the test for measuring repulsion of adhesive layers is described using the figures.

Figure 3A:
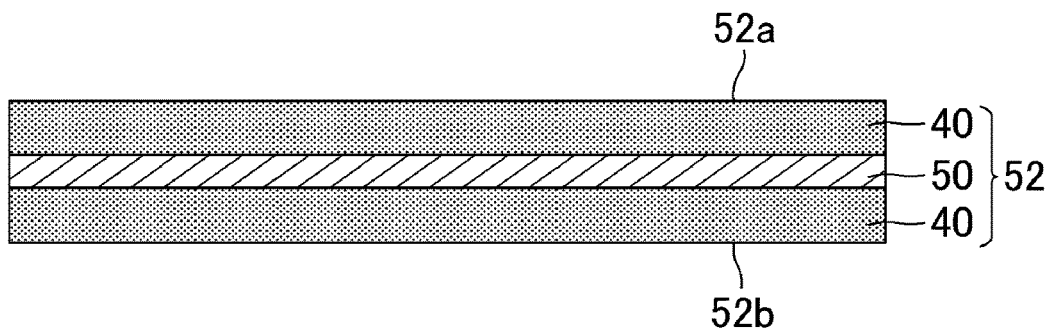
FIG. 3A is a cross-sectional view schematically showing one example of a sample of an adhesive layer produced in a test for measuring repulsion of adhesive layers.

FIG. 3A is a cross-sectional view schematically showing one example of a sample of an adhesive layer produced in a test for measuring repulsion of adhesive layers.

Figure 3B:
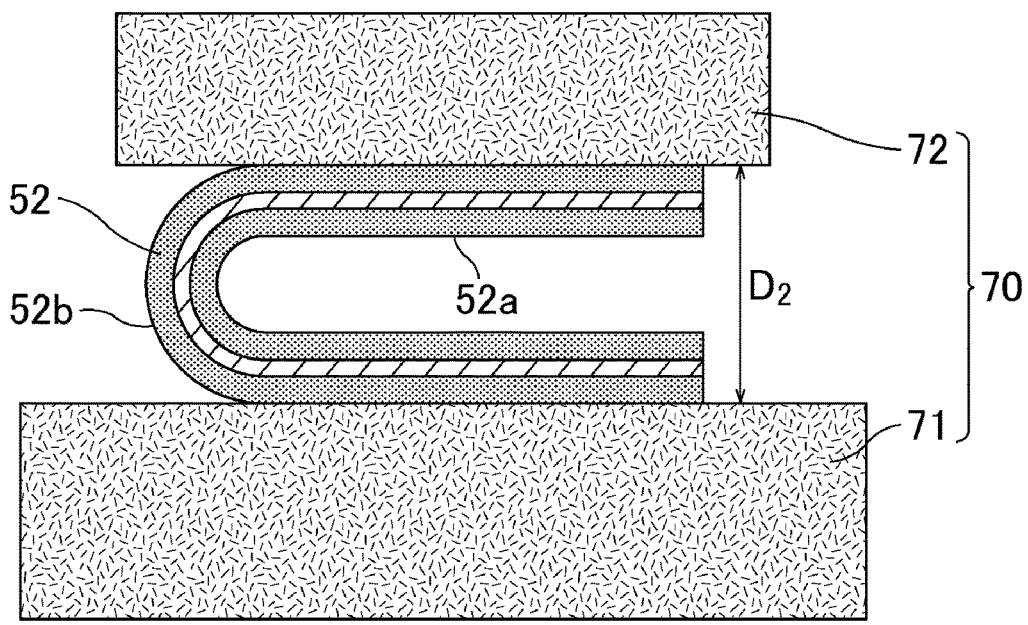
FIG. 3B is a diagram schematically showing how the repulsion of the adhesive layer is measured in the test for measuring repulsion of adhesive layers.

FIG. 3B is a diagram schematically showing how the repulsion of the adhesive layer is measured in the test for measuring repulsion of adhesive layers.

In order to perform the test for measuring repulsion of adhesive layers, first, two pieces of the adhesive layer 40 are produced.

Next, a polyimide film 50 with a thickness of 50 μm is prepared.

Then, one piece and the other piece of the adhesive layer 40 are stacked on one face and the other face of the polyimide film 50, respectively, such that the pieces overlap with each other.

Subsequently, the resulting stack is heated and pressurized at 3 MPa and 170° C. for three minutes, further heated at atmospheric pressure at 150° C. for one hour, and then cut to have a 60-mm long side and a 10-mm short side to produce a sample 52 of the adhesive layer 40 shown in FIG. 3A.

One main face and the other main face of the obtained sample 52 of the adhesive layer 40 are defined as a third main face 52a and a fourth main face 52b, respectively.

Next, as shown in FIG. 3B, the sample 52 of the adhesive layer 40 is bent into a U shape centered on a longitudinal center of the sample 52 of the adhesive layer 40 such that the long side of the sample 52 of the adhesive layer 40 is bent and the third main face 52a of the sample 52 of the adhesive layer 40 is on the inner side. Thereafter, the bent sample 52 of the adhesive layer 40 is placed on a pressure meter 70 equipped with a lower jig 71 and a pressing jig 72, and the distance (distance indicated by Symbol De in FIG. 3B) between the lower jig 71 and the pressing jig 72 is adjusted to 0.5 mm.

After maintaining this state for three seconds, a repulsion of the sample 52 of the adhesive layer 40 is measured and defined as Repulsion Y of the adhesive layer 40.

For example, the pressure meter 70 may be a table-top precision universal tester (Autograph AGS-X) available from Shimadzu Corporation.

With regard to Repulsion X of the stack and Repulsion Y of the adhesive layer measured as described above, a ratio of Repulsion Y to Repulsion X ([Repulsion Y]/[Repulsion X]) of 0.77 or higher means that the adhesive layer has a higher repulsion than conventional electromagnetic wave shielding films.

At a ratio of Repulsion Y to Repulsion X ([Repulsion Y]/[Repulsion X]) of 0.77 or higher, when a bending stress is applied to the electromagnetic wave shielding film 10, the adhesive layer functions as a support, so that the bending stress applied to the protecting layer and the metal layer is distributed and is less likely to focus on one point. Consequently, the protecting layer 20 is less likely to be broken by bending, whereby the bending resistance of the electromagnetic wave shielding film is improved.

The ratio of Repulsion Y to Repulsion X ([Repulsion Y]/[Repulsion X]) is preferably 0.82 or higher, more preferably 0.82 to 1.50.

In the electromagnetic wave shielding film 10, the Repulsion X of the stack including the protecting layer 20 and the metal layer 30 is preferably 1 to 10 N/cm, more preferably 2 to 6 N/cm.

If the Repulsion X is less than 1 N/cm, the protecting layer is too soft and is less likely to sufficiently protect the metal layer and the adhesive layer.

If the Repulsion X is more than 10 N/cm, the flexibility of the electromagnetic wave shielding film is likely to be reduced.

In the electromagnetic wave shielding film 10, the Repulsion Y of the adhesive layer 40 is preferably 0.77 to 15 N/cm, more preferably 1.64 to 9 N/cm.

If the Repulsion Y is less than 0.77 N/cm, the adhesive layer is too soft and is less likely to support the protecting layer. Therefore, the electromagnetic wave shielding film is likely to be broken.

If the Repulsion Y is more than 15 N/cm, the flexibility of the electromagnetic wave shielding film is likely to be reduced.

The structural elements of the electromagnetic wave shielding film 10 are described below.

Protecting Layer

The protecting layer 20 is not limited as long as it has a sufficient insulating property and can protect the metal layer 30 and the adhesive layer 40. The protecting layer 20 is preferably made of a thermoplastic resin composition, a thermosetting resin composition, or an active energy ray-curable composition, for example.

Examples of the thermoplastic resin composition include, but not limited to, a styrene resin composition, a vinyl acetate resin composition, a polyester resin composition, a polyethylene resin composition, a polypropylene resin composition, an imide resin composition, and an acrylic resin composition.

Examples of the thermosetting resin composition include, but not limited to, a phenolic resin composition, an epoxy resin composition, a urethane resin composition, a melamine resin composition, an alkyd resin composition, an imide resin composition, an amide resin composition, an amide-imide resin composition, a urea resin composition, a silicone resin composition, and a polyester resin composition.

Examples of the active energy ray-curable composition include, but not limited to, a polymerizable compound having at least two (meth)acryloyloxy groups in its molecule.

The protecting layer 20 may be made of a single material or two or more materials.

The protecting layer 20 may include a curing accelerator, a tackifier, an antioxidant, a pigment, a dye, a plasticizer, a UV absorber, a defoaming agent, a leveling agent, a filler, a flame retardant, a viscosity modifier, an antiblocking agent, or the like, if necessary.

The thickness of the protecting layer 20 is preferably 1 to 20 μm, more preferably 3 to 10 μm.

The Repulsion X of the stack can be controlled by the selection of the materials of the protecting layer 20, the adjustment of the amount of fillers added to the protecting layer 20, the adjustment of the thickness of the protecting layer 20, or the like.

Metal Layer

In the electromagnetic wave shielding film 10, the metal layer 30 functions as a shielding layer for shielding electromagnetic waves.

The metal layer 30 preferably includes at least one metal selected from the group consisting of copper, silver, gold, aluminum, nickel, tin, palladium, chromium, titanium, and zinc. The metal layer may include an alloy of at least two metals selected from these metals.

These metals are suitable for use in a shielding layer of the electromagnetic wave shielding film.

The metal layer 30 may be formed by a plating method or a vapor deposition method. The metal layer 30 may be a metal thin film such as a rolled copper foil.

Formation by a vapor deposition method is preferred among these. The metal layer 30 is more preferably a vapor deposited silver film.

The metal layer 30 has a thickness of preferably 0.05 to 10 μm, more preferably 0.1 to 6 μm.

The Repulsion X of the metal layer 30 can be controlled by the selection of the materials of the metal layer 30, the selection of the method of forming the metal layer 30, the adjustment of the thickness of the metal layer 30, or the like.

Adhesive Layer

Non-limiting examples of the materials of the adhesive layer 40 include thermoplastic resin compositions such as a styrene resin composition, a vinyl acetate resin composition, a polyester resin composition, a polyethylene resin composition, a polypropylene resin composition, an imide resin composition, an amide resin composition, and an acrylic resin composition; and thermosetting resin compositions such as a phenolic resin composition, an epoxy resin composition, a urethane resin composition, a melamine resin composition, and an alkyd resin composition.

The materials of the adhesive resin composition may be any one of these, or a combination of two or more thereof.

The adhesive layer 40 preferably includes conductive particles.

The adhesive layer 40 including conductive particles functions as a conductive adhesive layer.

The adhesive layer 40 capable of functioning as a conductive adhesive layer provides the following advantages.

The electromagnetic wave shielding film 10 is to be mounted on a printed wiring board.

A printed wiring board with the electromagnetic wave shielding film 10 mounted thereon is described using the figures.

Figure 4:
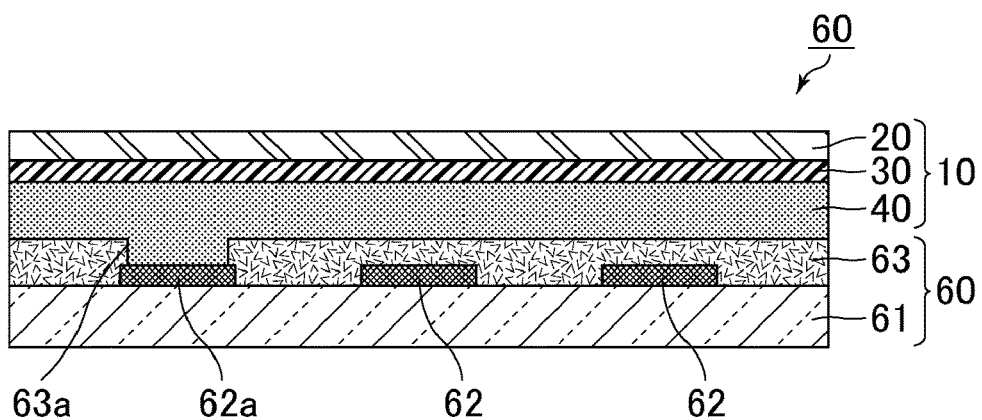
FIG. 4 is a cross-sectional view schematically showing one example of a printed wiring board with an electromagnetic wave shielding film according to the present invention mounted thereon.

FIG. 4 is a cross-sectional view schematically showing one example of a printed wiring board with an electromagnetic wave shielding film according to the present invention mounted thereon.

A printed wiring board 60 with the electromagnetic wave shielding film 10 mounted thereon includes a base film 61 provided with a printed circuit 62 including a ground circuit 62a and a coverlay 63 that is on the base film 61 and covers the printed circuit 62.

The coverlay 63 has an opening 63a to expose the ground circuit 62a. The adhesive layer 40 of the electromagnetic wave shielding film 10 comes into contact with the ground circuit 62a of the printed wiring board 60 through the opening 63a.

Thus, the metal layer 30 of the electromagnetic wave shielding film 10 is electrically connected to the ground circuit 62a of the printed wiring board 60.

In other words, when the adhesive layer includes conductive particles, the metal layer 30 of the electromagnetic wave shielding film 10 functions as a shielding layer. Then, the electrical connection of the metal layer to the ground circuit 62a of the printed wiring board 60 improves the electromagnetic wave shielding characteristics.

The type of the conductive particles is not limited and may be metal particles, carbon black, carbon nanotubes, carbon fibers, metallic fibers, or the like.

When the conductive particles are metal particles, the metal particles may be, but not limited to, silver powder, copper powder, gold powder, nickel powder, solder powder, aluminum powder, silver-coated copper powder created by subjecting copper powder to silver plating, or fine particles created by coating polymeric microparticles, glass beads, or the like with a metal.

The shape of the conductive particles is not limited. Examples of the shape include a spherical shape, a flat shape, a scale-like shape, a rod shape, a dendric shape, an elliptical shape, a fibrous shape, and a spike shape.

A flat shape and a dendric shape are preferred among these.

In the electromagnetic wave shielding film 10, the adhesive layer 40 includes the conductive particles in a weight ratio of preferably 30 wt % or higher, more preferably 50 to 80 wt %.

When the weight ratio of the conductive particles is 30 wt % or higher, the Repulsion Y of the adhesive layer is improved, thereby increasing the ratio of the Repulsion Y to the Repulsion Y. Thus, the bending resistance of the electromagnetic wave shielding film is improved.

The adhesive layer 40 has a thickness of preferably 1 to 30 μm, more preferably 3 to 15 μm.

The Repulsion Y of the adhesive layer 40 can be controlled by the selection of the materials of the adhesive layer 40, the adjustment of the amount of the conductive particles, the adjustment of the thickness of the adhesive layer 40, or the like.

EXAMPLES

Examples for illustrating the present invention more specifically is given below, but the present invention is not limited to these examples.

Example 1

An epoxy resin composition (30 wt % solids content) containing methyl ethyl ketone and a thermosetting epoxy resin was applied and then heated to dry to form an epoxy resin-containing protecting layer with a thickness of 5.00 µm.

Next, a vapor deposited silver film with a thickness of 0.30 µm was formed on the surface of the protecting layer.

Subsequently, a conductive adhesive was produced by mixing an epoxy resin with an atomized silver-coated copper powder.

Here, the weight ratio of the atomized silver-coated copper powder in the conductive adhesive was 30.00 wt %.

Thereafter, the conductive adhesive was applied to a thickness of 3.00 µm on the vapor deposited silver film, whereby an adhesive layer was formed.

Through the above steps, an electromagnetic wave shielding film in Example 1 was produced.

Moreover, a sample of a stack including a protecting layer and a metal layer and a sample of an adhesive layer in Example 1 were produced by the methods described below.

(I) Production of Sample of Stack Including Protecting Layer and Metal Layer (Stack of Protecting Layer/Metal Layer/Polyimide Film/Metal Layer/Protecting Layer)

An epoxy resin composition (30 wt % solids content) containing methyl ethyl ketone and a thermosetting epoxy resin was applied to a surface, which had undergone mold release treatment, of a PET film with a thickness of 60 µm, and then heated to dry to form an epoxy resin-containing protecting layer with a thickness of 5 µm.

Next, a vapor deposited silver film with a thickness of 0.3 µm was formed on the surface of the protecting layer to produce a piece of a stack x'. A total two pieces of the stack x' were produced by the same operation.

Subsequently, a thermosetting epoxy resin composition (30 wt % solids content) containing methyl ethyl ketone and a thermosetting epoxy resin was applied to the surface of the vapor deposited silver film of each piece of the stack x', and then heated to dry to form a thermosetting epoxy resin layer with a thickness of 1 µm.

Next, a polyimide film with a thickness of 50 µm was prepared. One piece and the other piece of the stack x' were stacked on one face and the other face of the polyimide film, respectively, such that the pieces overlapped with each other, while the thermosetting epoxy resin layer on each stack x' was brought into contact with the polyimide film.

Thereafter, the resulting stack was heated and pressurized at 3 MPa and 170° C. for three minutes, further heated at atmospheric pressure and 150° C. for one hour, and then cut to have a 60-mm long side and a 10-mm short side, followed by peeling of the PET film having undergone mold release treatment, whereby a sample of the stack x (a stack of protecting layer/vapor deposited silver film layer/polyimide film/vapor deposited silver film layer/protecting layer) was produced.

(II) Production of Sample of Adhesive Layer (a Stack of Adhesive Layer/Polyimide Film/Adhesive Layer)

A conductive adhesive composition was produced by mixing a thermosetting epoxy resin with an atomized silver-coated copper powder. Here, the weight ratio of the atomized silver-coated copper powder in the conductive adhesive composition was 30 wt %.

The conductive adhesive composition was applied to a surface, which had undergone mold release treatment, of a PET film with a thickness of 60 µm, and then heated to dry to form a conductive adhesive layer with a thickness of 3 µm, whereby a stack y' was produced. A total two pieces of the stack y' were produced by the same operation.

Next, a polyimide film with a thickness of 50 µm was prepared. One piece and the other piece of the stack y' were stacked on one face and the other face of the polyimide film, respectively, such that the pieces overlapped with each other, while the conductive adhesive layer of each stack y' was brought into contact with the polyimide film.

Thereafter, the resulting stack was heated and pressurized at 3 MPa and 170° C. for three minutes, further heated at atmospheric pressure and 150° C. for one hour, and then cut to have a 60-mm long side and a 10-mm short side, followed by peeling of the PET film having undergone mold release treatment, whereby a sample of the stack y (a stack of adhesive layer/polyimide film/adhesive layer) including the adhesive layer was produced.

Examples 2 to 14 and Comparative Example 1

Electromagnetic wave shielding films in Examples 2 to 14 and Comparative Example 1 were produced as in Example 1, except that the types and the amounts of the conductive particles were changed as indicated in Table 1 and Table 2.

Moreover, samples of stacks each including a protecting layer and a metal layer and samples of adhesive layers in Examples 2 to 14 and Comparative Example 1 were produced as in Example 1.

TABLE 1

|  |  | Example 1 | Example 2 | Example 3 | Example 4 |
| --- | --- | --- | --- | --- | --- |
| Protecting layer | Type | Epoxy resin | Epoxy resin | Epoxy resin | Epoxy resin |
|  | Thickness (µm) | 5.00 | 5.00 | 5.00 | 5.00 |
| Metal layer | Type | Vapor deposited silver film | Vapor deposited silver film | Vapor deposited silver film | Vapor deposited silver film |
|  | Thickness (µm) | 0.30 | 0.30 | 0.30 | 0.30 |
| Adhesive layer | Resin | Epoxy resin | Epoxy resin | Epoxy resin | Epoxy resin |
|  | Conductive Type particles | Atomized silver-coated copper powder | Dendric shape silver-coated copper powder | Dendric shape silver-coated copper powder | Dendric shape silver-coated copper powder |
|  | Amount (wt %) | 30.00 | 30.00 | 40.00 | 50.00 |
|  | Thickness (µm) | 3.00 | 5.00 | 5.00 | 5.00 |
| Repulsion X of stack (N/cm) |  | 3.62 | 3.62 | 3.62 | 3.62 |
| Repulsion Y of adhesive layer (N/cm) |  | 2.79 | 2.80 | 2.87 | 2.98 |
| RepulsionY/Repulsion X |  | 0.77 | 0.77 | 0.79 | 0.82 |
| Evaluation of bending resistance (number of times until breaking) |  | 14180 | 16963 | 20089 | 21892 |

TABLE 1-continued

|  |  | Example 5 | Example 6 | Example 7 |
|---|---|---|---|---|
| Protecting layer | Type | Epoxy resin | Epoxy resin | Epoxy resin |
|  | Thickness (μm) | 5.00 | 5.00 | 5.00 |
| Metal layer | Type | Vapor deposited silver film | Vapor deposited silver film | Vapor deposited silver film |
|  | Thickness (μm) | 0.30 | 0.30 | 0.30 |
| Adhesive layer | Resin | Epoxy resin | Epoxy resin | Epoxy resin |
|  | Conductive particles Type | Dendric shape silver-coated copper powder | Dendric shape silver-coated copper powder | Dendric shape silver-coated copper powder |
|  | Amount (wt %) | 60.00 | 70.00 | 80.00 |
|  | Thickness (μm) | 5.00 | 5.00 | 5.00 |
| Repulsion X of stack (N/cm) |  | 3.62 | 3.62 | 3.62 |
| Repulsion Y of adhesive layer (N/cm) |  | 3.02 | 3.15 | 3.26 |
| Repulsion Y/Repulsion X |  | 0.83 | 0.87 | 0.90 |
| Evaluation of bending resistance (number of times until breaking) |  | 24219 | 30404 | 45353 |

TABLE 2

|  |  | Example 8 | Example 9 | Example 10 | Example 11 |
|---|---|---|---|---|---|
| Protecting layer | Type | Epoxy resin | Epoxy resin | Epoxy resin | Epoxy resin |
|  | Thickness (μm) | 5.00 | 5.00 | 5.00 | 5.00 |
| Metal layer | Type | Vapor deposited silver film | Vapor deposited silver film | Vapor deposited silver film | Vapor deposited silver film |
|  | Thickness (μm) | 0.30 | 0.30 | 0.30 | 0.30 |
| Adhesive layer | Resin | Epoxy resin | Epoxy resin | Epoxy resin | Epoxy resin |
|  | Conductive particles Type | Flake silver-coated copper powder | Flake silver-coated copper powder | Flake silver-coated copper powder | Flake silver-coated copper powder |
|  | Amount (wt %) | 20.00 | 30.00 | 40.00 | 50.00 |
|  | Thickness (μm) | 5.00 | 5.00 | 5.00 | 5.00 |
| Repulsion X of stack (N/cm) |  | 3.62 | 3.62 | 3.62 | 3.62 |
| Repulsion Y of adhesive layer (N/cm) |  | 3.10 | 3.23 | 3.31 | 3.36 |
| Repulsion Y/Repulsion X |  | 0.86 | 0.89 | 0.91 | 0.93 |
| Evaluation of bending resistance (number of times until breaking) |  | 20081 | 21238 | 22011 | 22862 |

|  |  | Example 12 | Example 13 | Example 14 | Comparative Example 1 |
|---|---|---|---|---|---|
| Protecting layer | Type | Epoxy resin | Epoxy resin | Epoxy resin | Epoxy resin |
|  | Thickness (μm) | 5.00 | 5.00 | 5.00 | 5.00 |
| Metal layer | Type | Vapor deposited silver film | Vapor deposited silver film | Vapor deposited silver film | Vapor deposited silver film |
|  | Thickness (μm) | 0.30 | 0.30 | 0.30 | 0.30 |
| Adhesive layer | Resin | Epoxy resin | Epoxy resin | Epoxy resin | Epoxy resin |
|  | Conductive particles Type | Flake silver-coated copper powder | Flake silver-coated copper powder | Flake silver-coated copper powder | Dendric shape silver-coated copper powder |
|  | Amount (wt %) | 60.00 | 70.00 | 80.00 | 20.00 |
|  | Thickness (μm) | 5.00 | 5.00 | 5.00 | 5.00 |
| Repulsion X of stack (N/cm) |  | 3.62 | 3.62 | 3.62 | 3.62 |
| Repulsion Y of adhesive layer (N/cm) |  | 3.41 | 3.61 | 3.73 | 2.73 |
| Repulsion Y/Repulsion X |  | 0.94 | 1.00 | 1.03 | 0.76 |
| Evaluation of bending resistance (number of times until breaking) |  | 26287 | 58059 | 181750 | 10906 |

The atomized silver-coated copper powder, the dendric shape silver-coated copper powder, and the flake silver-coated copper powder in Tables 1 and 2 each had an average particle size (D50 measured by a laser diffraction scattering particle size distribution method) of 6 μm.

Repulsion Test

A test for measuring repulsion of stacks and a test for measuring repulsion of adhesive layers were performed using the samples of the stacks each containing a protecting layer and a metal layer and the samples of the adhesive layer in the Examples and Comparative Example 1.

The pressure meter used in the test for measuring repulsion of stacks and the test for measuring repulsion of adhesive layers was a table-top precision universal tester (Autograph AGS-X) available from Shimadzu Corporation. In the pressure measurement test, a stack (stack x) or an adhesive layer (stack y) was held between a pressing jig and a lower jig, and then pressed by moving the pressing jig at a rate of 1.0 mm/min to reduce the distance between the pressing jig and the lower jig to 0.5 mm. The distance of 0.5 mm was maintained for three seconds, and thereafter, the Repulsion X of the stack (stack x) including the protecting layer and the metal layer or the Repulsion Y of the adhesive layer (stack y) was measured.

Moreover, the ratio of Repulsion Y to Repulsion X was determined. Table 1 and Table 2 show the results.

Evaluation of Bending Resistance

The electromagnetic wave shielding films according to the Examples and Comparative Example 1 were evaluated in the following manner.

Two sheets of the electromagnetic wave shielding films were heat-pressed to be adhered to the respective faces of a polyimide film with a thickness of 50 μm, and the resultant was cut into a sample having a size of length×width=130 mm×15 mm. The bending resistance of the sample was determined using a MIT folding fatigue resistance tester (No. 307 MIT Type Folding Endurance Tester, available from YASUDA SEIKI SEISAKUSHO, LTD.) in accordance with the method defined in JIS P 8115:2001.

The test conditions are as follows.

Top of the folding clamp, R: 0.38 mm
Folding angle: +135°
Folding speed: 175 cpm
Weight load: 500 gf
Detection method: sensing breaking in the shielding film by a built-in conducting unit Table 1 and Table 2 show the evaluation results, specifically, the number of times until breaking.

Table 1 and Table 2 show that an electromagnetic wave shielding film with a ratio of Repulsion Y to Repulsion X of 0.77 or higher has high bending resistance.

REFERENCE SIGNS LIST

10 electromagnetic wave shielding film
20 protecting layer
30 metal layer
40 adhesive layer
50 polyimide film
51 sample of stack
51a first main face
51b second main face
52 sample of adhesive layer
52a third main face
52b fourth main face
60 printed wiring board
61 base film
62 printed circuit
62a ground circuit
63 coverlay
63a opening
70 pressure meter
71 lower jig
72 pressing jig

The invention claimed is:

1. An electromagnetic wave shielding film, comprising a protecting layer, a metal layer, and an adhesive layer stacked in this order,
wherein a ratio of Repulsion Y to Repulsion X ([Repulsion Y]/[Repulsion X]) is 0.77 or higher, where Repulsion X denotes a repulsion of a stack including the protecting layer and the metal layer measured in a test for measuring repulsion of stacks described below, and Repulsion Y denotes a repulsion of the adhesive layer measured in a test for measuring repulsion of adhesive layers described below,
Test for measuring repulsion of stacks;
Two pieces of a stack including a protecting layer and a metal layer are produced;
Next, a polyimide film with a thickness of 50 μm is prepared; One piece and the other piece of the stack are stacked on one face and the other face of the polyimide film, respectively, such that the pieces overlap with each other, while the metal layer is placed on the polyimide film via an epoxy resin-based adhesive with a thickness of 1 μm;
Subsequently, the resulting stack is heated and pressurized at 3 MPa and 170° C. for three minutes, further heated at atmospheric pressure at 150° C. for one hour, and then cut to have a 60-mm long side and a 10-mm short side to produce a sample of the stack;
One main face and the other main face of the obtained sample of the stack are defined as a first main face and a second main face, respectively;
Next, the sample of the stack is bent into a U shape centered on a longitudinal center of the sample of the stack such that the long side of the sample of the stack is bent and the first main face of the sample of the stack is on the inner side; Thereafter, the bent sample of the stack is placed on a pressure meter equipped with a lower jig and a pressing jig, and the distance between the lower jig and the pressing jig is adjusted to 0.5 mm;
After maintaining this state for three seconds, a repulsion of the sample of the stack is measured and defined as Repulsion X of the stack;
Test for measuring repulsion of adhesive layers;
Two pieces of an adhesive layer are produced;
Next, a polyimide film with a thickness of 50 μm is prepared, One piece and the other piece of the adhesive layer are stacked on one face and the other face of the polyimide film, respectively, such that the pieces overlap with each other;
Subsequently, the resulting stack is heated and pressurized at 3 MPa and 170° C. for three minutes, further heated at atmospheric pressure at 150° C. for one hour, and then cut to have a 60-mm long side and a 10-mm short side to produce a sample of the adhesive layer;
One main face and the other main face of the obtained sample of the adhesive layer are defined as a third main face and a fourth main face, respectively;
Next, the sample of the adhesive layer is bent into a U shape centered on a longitudinal center of the sample of the adhesive layer such that the long side of the sample of the adhesive layer is bent and the third main face of the sample of the adhesive layer is on the inner side; Thereafter, the bent sample of the adhesive layer is placed on a pressure meter equipped with a lower jig and a pressing jig, and the distance between the lower jig and the pressing jig is adjusted to 0.5 mm;
After maintaining this state for three seconds, a repulsion of the sample of the adhesive layer is measured and defined as Repulsion Y of the adhesive layer.

2. The electromagnetic wave shielding film according to claim 1,
wherein the ratio of the Repulsion Y to the Repulsion X ([Repulsion Y]/[Repulsion X]) is 0.82 or higher.

3. The electromagnetic wave shielding film according to claim 1, wherein the adhesive layer comprises conductive particles.

4. The electromagnetic wave shielding film according to claim 3, wherein the adhesive layer comprises the conductive particles in a weight ratio of 30 wt % or higher.

5. The electromagnetic wave shielding film according to claim 1, wherein the Repulsion X is 1 to 10 N/cm.

6. The electromagnetic wave shielding film according to claim 1, wherein the Repulsion Y is 0.77 to 15 N/cm.

* * * * *